(12) United States Patent
Bhosale et al.

(10) Patent No.: US 12,469,777 B2
(45) Date of Patent: Nov. 11, 2025

(54) BEOL INTERCONNECT SUBTRACTIVE ETCH SUPER VIA

(71) Applicant: International Business Machines Corporation, Armonk, NY (US)

(72) Inventors: Prasad Bhosale, Albany, NY (US); Nicholas Anthony Lanzillo, Wynantskill, NY (US); Lawrence A. Clevenger, Saratoga Springs, NY (US); Michael Rizzolo, Delmar, NY (US)

(73) Assignee: International Business Machines Corporation, Armonk, NY (US)

( * ) Notice: Subject to any disclaimer, the term of this patent is extended or adjusted under 35 U.S.C. 154(b) by 825 days.

(21) Appl. No.: 17/543,964

(22) Filed: Dec. 7, 2021

(65) Prior Publication Data

US 2023/0178474 A1 Jun. 8, 2023

(51) Int. Cl.
| | |
|---|---|
| *H01L 23/522* | (2006.01) |
| *H01L 21/311* | (2006.01) |
| *H01L 21/3213* | (2006.01) |
| *H01L 21/768* | (2006.01) |
| *H01L 23/528* | (2006.01) |

(52) U.S. Cl.
CPC .... *H01L 23/5226* (2013.01); *H01L 21/31144* (2013.01); *H01L 21/32139* (2013.01); *H01L 21/76807* (2013.01); *H01L 21/76816* (2013.01); *H01L 23/5283* (2013.01)

(58) Field of Classification Search
CPC .......... H01L 23/5226; H01L 21/31144; H01L 23/5223
USPC ........................................................ 257/624
See application file for complete search history.

(56) References Cited

U.S. PATENT DOCUMENTS

| | | | |
|---|---|---|---|
| 8,299,609 B2 | 10/2012 | Cohn et al. | |
| 8,357,609 B2 | 1/2013 | Ryan | |
| 9,502,350 B1 | 11/2016 | Bonilla et al. | |
| 9,601,426 B1 | 3/2017 | Bonilla et al. | |
| 10,020,254 B1* | 7/2018 | Bao | H01L 23/53228 |
| 10,020,255 B1 | 7/2018 | Bao et al. | |
| 10,177,031 B2 | 1/2019 | Bao et al. | |
| 10,256,186 B2 | 4/2019 | Bonilla et al. | |
| 2006/0178002 A1* | 8/2006 | Kim | H01L 21/76808 438/622 |
| 2014/0123348 A1* | 5/2014 | Evans | G01Q 70/02 850/53 |
| 2018/0033684 A1* | 2/2018 | Singh | H01L 23/5329 |
| 2018/0145128 A1* | 5/2018 | Wang | H01L 23/5226 |

(Continued)

*Primary Examiner* — Dzung Tran
(74) *Attorney, Agent, or Firm* — Scully, Scott, Murphy & Presser, P.C.; L. Jeffrey Kelly, Esq.

(57) ABSTRACT

Semiconductor devices including a super via connection between levels are provided. The semiconductor device can include a first interlevel dielectric layer, a back-end-of-line (BEOL) interconnect structure disposed in the first interlevel dielectric layer, a second interlevel dielectric layer disposed on a first portion of the first interlevel dielectric layer, a third interlevel dielectric layer disposed on the second interlevel dielectric layer, and a super via disposed on a second portion of the first interlevel dielectric layer, wherein a first end of the super via is connected to the BEOL interconnect structures and wherein a second end of the super via opposite the first end of the super via is a distance from the first interlevel dielectric layer larger than a height distance of the second interlevel dielectric layer.

10 Claims, 17 Drawing Sheets

(56) References Cited

U.S. PATENT DOCUMENTS

2020/0058585 A1\* 2/2020 Xu .................... H01L 21/76816
2020/0098688 A1\* 3/2020 Shi .................... H01L 21/28568
2020/0411317 A1 12/2020 Ecton et al.
2021/0193566 A1\* 6/2021 Lo ....................... H01L 21/7682

\* cited by examiner

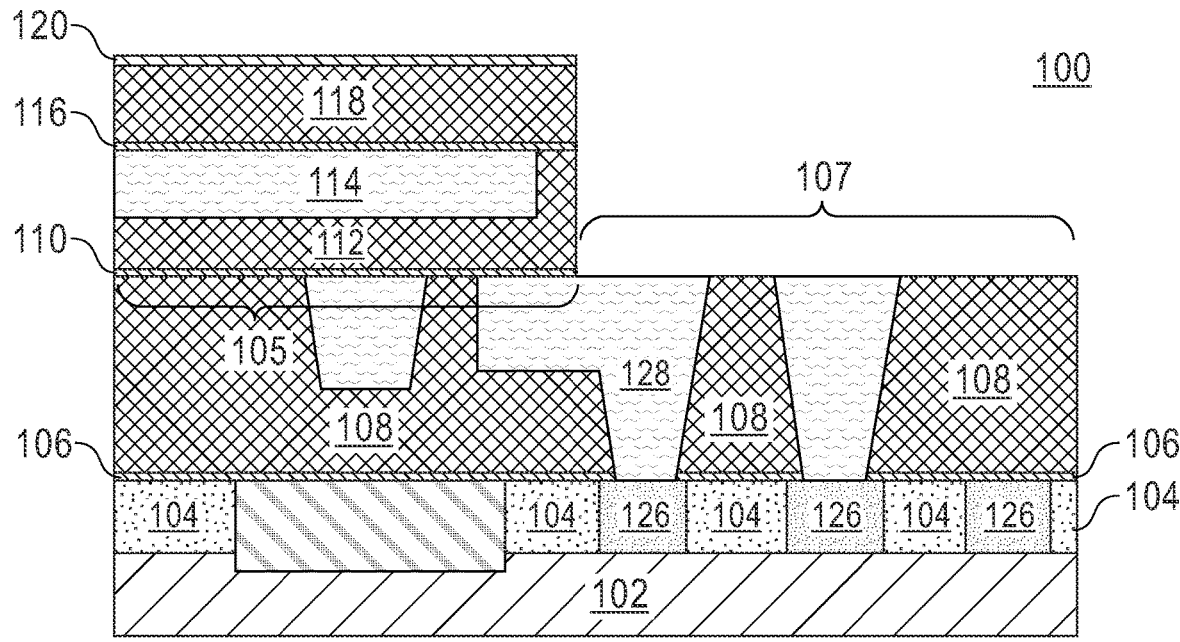

FIG. 3A

Subtractively Etching a Portion of a Second Interlevel Dielectric Layer and a Portion of a Third Interlevel Dielectric Layer
S1002

Forming a First Conductive Material Layer on the Third Interlevel Dielectric abd a First Portion of the First Interlevel Dielectric Layer
S1004

Subtractively Etching the First Conductive Material to Form a Super Via on a Second Portion of a First Interlevel Dielectric Layer
S1006

Forming an ILD Via Layer
S1008

FIG. 3B

BEOL INTERCONNECT SUBTRACTIVE ETCH SUPER VIA

BACKGROUND

The present application relates to back-end-of-the-line (BEOL) technology. More particularly, the present application relates to BEOL interconnect structures and methods of forming the same.

Generally, BEOL interconnect devices include a plurality of circuits which form an integrated circuit fabricated on a BEOL interconnect substrate. A complex network of signal paths will normally be routed to connect the circuit elements distributed on the surface of the substrate. Efficient routing of these signals across the device requires formation of multilevel or multilayered schemes, such as, for example, single or dual damascene wiring, i.e., interconnect, structures.

Within typical BEOL interconnect structures, electrically conductive metal vias run perpendicular to the BEOL interconnect substrate and electrically conductive metal lines run parallel to the BEOL interconnect substrate. Typically, the electrically conductive metal vias are present beneath the electrically conductive metal lines and both features are embedded within an interconnect dielectric material layer.

SUMMARY

Embodiments of the invention provide devices and methods for forming back-end-of-line (BEOL) interconnect structures that include super vias.

In one embodiment of the present disclosure, a semiconductor device including a super via connection between levels is provided. The semiconductor device can include a first interlevel dielectric layer, a BEOL interconnect structure disposed in the first interlevel dielectric layer, a second interlevel dielectric layer disposed on a first portion of the first interlevel dielectric layer, a third interlevel dielectric layer disposed on the second interlevel dielectric layer, and a super via disposed on a second portion of the first interlevel dielectric layer, wherein a first end of the super via is connected to the BEOL interconnect structures and wherein a second end of the super via opposite the first end of the super via is a distance from the first interlevel dielectric layer larger than a height distance of the second interlevel dielectric layer.

In another embodiment of the present disclosure a method for fabricating a semiconductor device including a super via is provided. The method includes subtractively etching a portion of a second interlevel dielectric layer and a portion of a third interlevel dielectric layer, wherein the remaining second interlevel dielectric layer is disposed on a first portion of a first interlevel dielectric layer and the remaining third interlevel dielectric layer is disposed on the second interlevel dielectric layer, forming a first conductive material layer on the third interlevel dielectric and a second portion of the first interlevel dielectric layer, and subtractively etching the first conductive material to form a super via on the second portion of a first interlevel dielectric layer, wherein a first end of the super via is connected to a back-end-of-line (BEOL) interconnect structure disposed in the first interlevel dielectric layer, and wherein a second end of the super via opposite the second end of the super via is a distance from the first interlevel dielectric layer larger than a height distance of the second interlevel dielectric layer.

In another embodiment of the present disclosure an integrated circuit is provided. The integrated circuit includes a semiconductor device including a super via connection between dielectric levels. The semiconductor device includes a first interlevel dielectric layer, a back-end-of-line (BEOL) interconnect structure disposed in the first interlevel dielectric layer, a second interlevel dielectric layer disposed on a first portion of the first interlevel dielectric layer, a third interlevel dielectric layer disposed on the second interlevel dielectric layer, and a super via disposed on a second portion of the first interlevel dielectric layer, wherein a first end of the super via is connected to the BEOL interconnect structures and wherein a second end of the super via opposite the first end of the super via is a distance from the first interlevel dielectric layer larger than a height distance of the second interlevel dielectric layer.

BRIEF DESCRIPTION OF SEVERAL VIEWS OF THE DRAWINGS

FIG. 3A depicts a side cross-sectional view of a structure with a back-end-of-line interconnect structure, of an embodiment of the disclosure.

FIG. 3B depicts a process flow for a structure of an embodiment of the disclosure.

DETAILED DESCRIPTION

Figure 1:
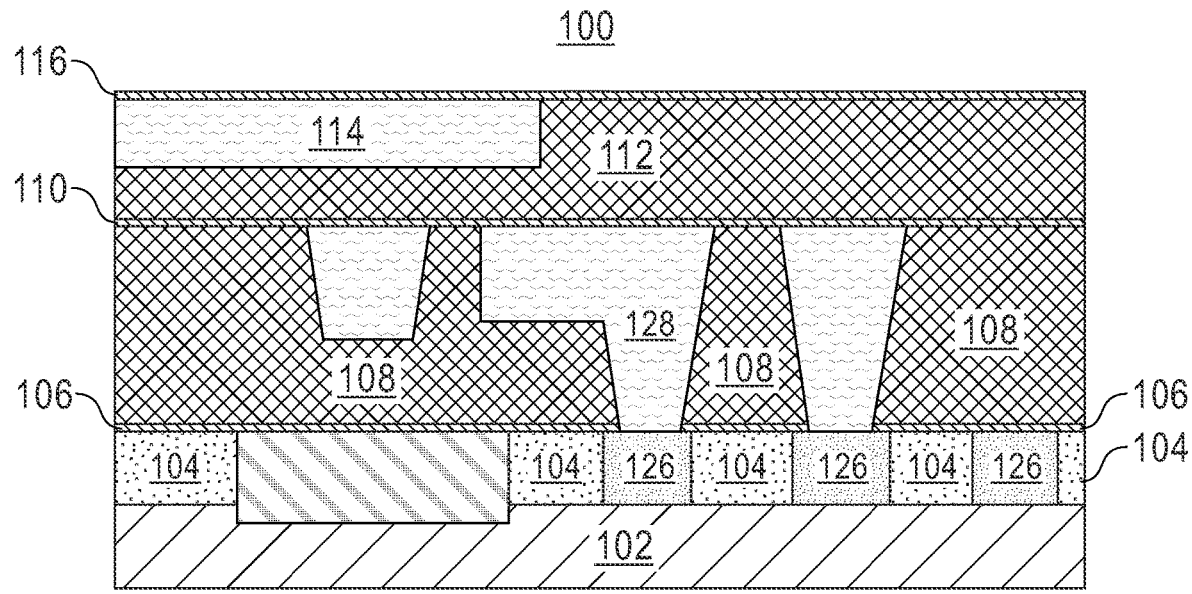
FIG. 1 depicts a side cross-sectional view of a structure with a back-end-of-line interconnect structure, of an embodiment of the disclosure.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It should also be understood that material compounds will be described in terms of listed elements, e.g., SiGe. These compounds include different proportions of the elements within the compound, e.g., SiGe includes $SiGe_{1-x}$ where x is less than or equal to 1, etc. In addition, other elements can be included in the compound and still function in accordance with the present principles. The compounds with additional elements will be referred to herein as alloys.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As used herein, the term "substantially" is intended to accommodate manufacturing tolerances and indicates that the value listed may be somewhat altered, as long as the alteration does not result in nonconformance of the process or structure to the illustrated embodiment. For example, for some elements the term "substantially" or the term "about" can refer to a comparative variation of ±0.1%, for other elements, the term "substantially" or the term "about" can refer to a comparative variation of ±1% or ±10%, or any point therein.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

A semiconductor device can include multiple levels ("levels"), each including a conductive line ("line") formed in an interlevel dielectric layer (ILD). The term levels is used herein, with these levels able to be formed to include any metal and/or suitable conductive material in accordance with the embodiments described herein. Upper lines can be connected to lower lines by vias. Levels can be identified herein using the designation X, where X is a positive integer from 1 to N. The levels are identified from the level closest to the substrate to the level furthest from the substrate as 1 through N where 1 is the first or lowermost level and N is the last or uppermost level. A line in the X level is designated as an $M_X$ line, and a via in the X level is designated as a $V_{(X-1)}$ via. Note that there are no $V_0$ vias or via bars. When a line in an upper level is designated $M_X$, then a line in an immediately lower level can be designated $M_{(X-1)}$. Likewise, when a line in a lower level is designated $M_X$, then a line in an immediately higher level is designated $M_{(X+1)}$. For a first level (X=1), the line is $M_1$ and there are no "$V_0$" vias as the connection from $M_1$ to devices below $M_1$ is generally made through separately formed contacts in a contact layer ("CA"). For a second level (X=2), the line is $M_2$ and the vias are $V_1$ and, for a third level (X=3), the line is $M_3$ and the vias or via bars are $V_2$.

The embodiments described herein provide for the fabrication of a super via, also referred to as a skip via, in a subtractive etch back-end-of-line (BEOL) integration scheme. A super via in accordance with the embodiments described herein can provide a connection between conductive lines of respective levels in a manner that bypasses one or more intermediate levels. More specifically, a super via $SV_X$ can connect an $M_X$ line to an $M_{X+2}$ line, a $M_{X+3}$ line, an $M_{X+4}$ line, etc. thereby bypassing the X+1 level and the corresponding $M_{(X+1)}$ line, the X+2 level and the corresponding $M_{(X+2)}$ line, the X+3 level and the corresponding $M_{(X+3)}$ line, etc. The embodiments described herein can reduce high resistance barrier interfaces and can enable frequency enhancement for FPG (e.g., up to about 2% frequency enhancement, or more).

The super via can provide design benefits for BEOL interconnects, and the subtractive etch of conductive materials with a super via can provide additional design flexibility.

One example of design flexibility in some embodiments is the ability to implement non-copper (Cu) conductive materials that can be subtractive etched to form the super via, referred to herein as alternate conductive materials. Examples of alternate conductive materials include, but are not limited to, ruthenium (Ru), cobalt (Co), etc.

Another example of design flexibility in some embodiments is choice of conductive materials. For example, if a super via $SV_X$ includes Ru, then (1) the via $V_X$ can include Ru and the via $V_{(X+1)}$ can include Ru; (2) the via $V_X$ can include Ru and the via $V_{(X+1)}$ can include Cu, etc. In one embodiment, an initial metal (e.g., Ru) can be deposited as a blanket to minimize resistivity, which can allow for a Cu line $M_X$ to land directly on a high-quality via (e.g., Ru via), thereby further minimizing via resistance. Accordingly, the subtractive etch scheme described herein can accommodate the use of a variety of conductive materials (e.g., metals).

Yet another example of design flexibility in some embodiments is that subtractive and damascene and metallization techniques (additive metal) can be co-integrated in accordance with the embodiments described herein to customize the formation of the levels. For example, although the super via $SV_X$ described herein is formed using a subtractive etch scheme, the conductive lines $M_X$ and the $M_{(X+2)}$ in contact with $SV_X$ can themselves be formed using a combination of subtractive etch schemes and/or damascene schemes (e.g., filling a trench with conductive material).

Referring first to FIG. 1, FIG. 1 is a side cross-sectional view of a device 100 that includes a substrate 102, a first interlayer dielectric (ILD) layer 104, a contact 126, a capping layer 106, an interconnect structure 128, an M1 ILD layer 108, a capping layer 110, an M2 ILD layer 112, a line/via 114, a capping layer 116, an M3 ILD layer 118 and a capping layer 120.

The substrate 102 may comprise a semiconductor substrate comprising silicon (Si), although other suitable materials may be used. For example, the substrate 102 can include any suitable substrate structure, e.g., a bulk semiconductor. The substrate 102 can include a silicon-containing material. Illustrative examples of Si-containing materials suitable for the substrate 102 can include, but are not limited to, Si, silicon germanium (SiGe), silicon germanium carbide (SiGeC), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc. The size of the substrate 102 may vary, such as based on the number of transistors or other device features that will be formed thereon.

Each of the ILD layers, first ILD layer 104, M1 ILD layer 108, M2 ILD layer 112 and M3 ILD layer 118 (shown in FIG. 2) may be the same material as each other ILD layer, or one or more of the ILD layers can differ from another of the other ILD layers. Each of the ILD layers are formed of silicon dioxide ($SiO_2$) or another silicon oxide ($SiO_x$), silicon oxynitride (SiON), silicon oxycarbide (SiOC), etc. Each of the ILD layers may also comprise an ultra low-k dielectric material (e.g., a material with a dielectric constant less than that of $SiO_2$). Each of the ILD layers may have a height or vertical thickness (in direction Y-Y') in the range of about 10 to 100 nanometers (nm). Also, each of the ILD layers can be deposited in any suitable way.

Each of the capping layers, caping layer 106, capping layer 110, capping layer 116 and capping layer 120 (shown in FIG. 2) may be the same material as each other capping layer, or one or more of the capping layers can differ from another of the other capping layers. Each of the capping layers can comprise silicon nitride (SiN) or another suitable material such as silicon oxynitride (SiON), a low-k dielectric, a high-k dielectric, silicon borocarbonitride (SiBCN), silicon oxycarbide (SiOC), silicon boro oxycarbide (SiBOC), silicon boron nitride (SiBN), silicon carbon oxygen hydrogen (SiCOH), or combinations thereof, although other insulating dielectrics are also contemplated. Each of the capping layers may have a height or vertical thickness (in direction Y-Y') in the range of 2 to 20 nm. Also, each of the capping layers can be deposited in any suitable way.

The contact 126 in this embodiment is assumed to be a connection to a transistor (e.g., a fin-type field-effect transistor or FinFET), and may be formed of tungsten (W), Co, ruthenium (Ru) or another suitable material. The contact 126 may have a height or vertical thickness (in direction Y-Y') that substantially or approximately matches the height or vertical thickness of the ILD layer 104.

The interconnect structure 128 may be formed of Cu, or another suitable material, and may have a width (in direction X-X') that is approximately the same as the width of the contact 126. The interconnect structure 128 can be formed according to a dual damascene processing including lithography and etching.

Figure 2:
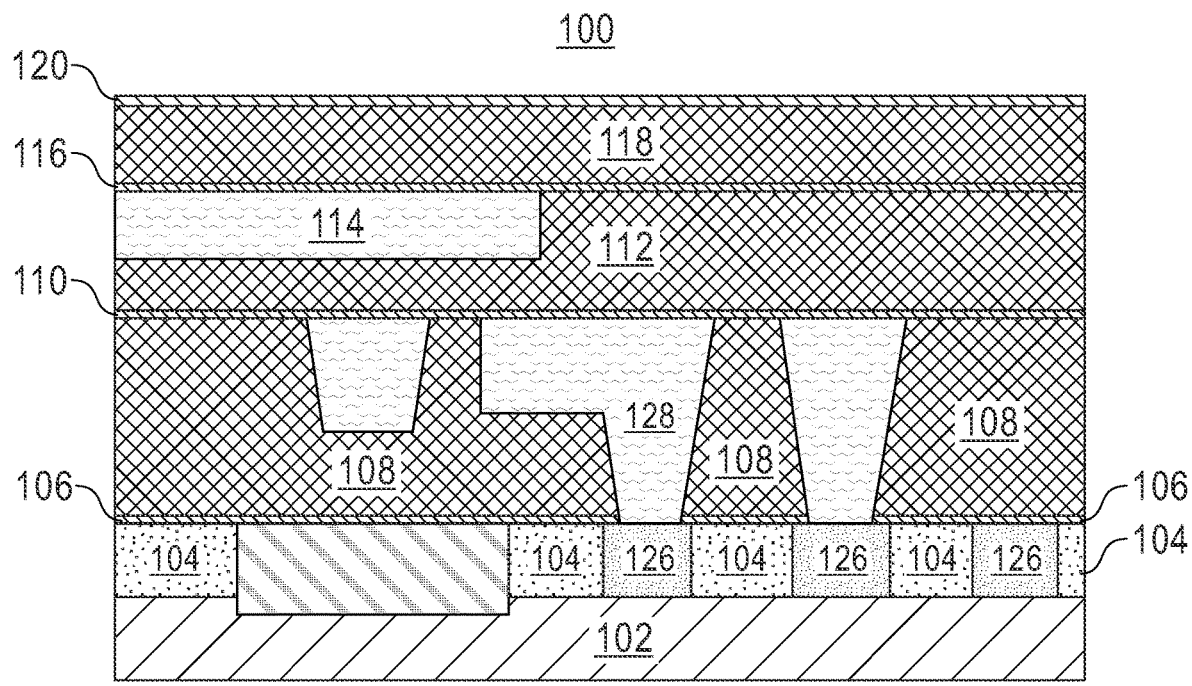
FIG. 2 depicts a side cross-sectional view of a structure with a back-end-of-line interconnect structure, of an embodiment of the disclosure.

In the embodiment shown in FIG. 2, the device 100 includes the M3 ILD layer 118 formed on the capping layer 116 and the capping layer 120 formed on the M3 ILD layer 118. Each of the M3 ILD layer 118 and the capping layer 120 can be deposited in any suitable way.

As seen in FIG. 3A, a portion of the M2 ILD layer 112 and a portion of the M3 ILD layer 118 have been subtractively etched, using any suitable etching procedure (e.g. reactive-ion-etching (RIE)). This subtractive etching occurs in S1002 of method 1000 of FIG. 3B. The portion of the M2 ILD layer 112 remaining after S1002 is disposed on a first portion 105 of the M1 ILD layer 108, with the portion of the M3 ILD layer 118 remaining after S1002 disposed on the portion of the M2 ILD layer 112 remaining after S1002.

Figure 4:
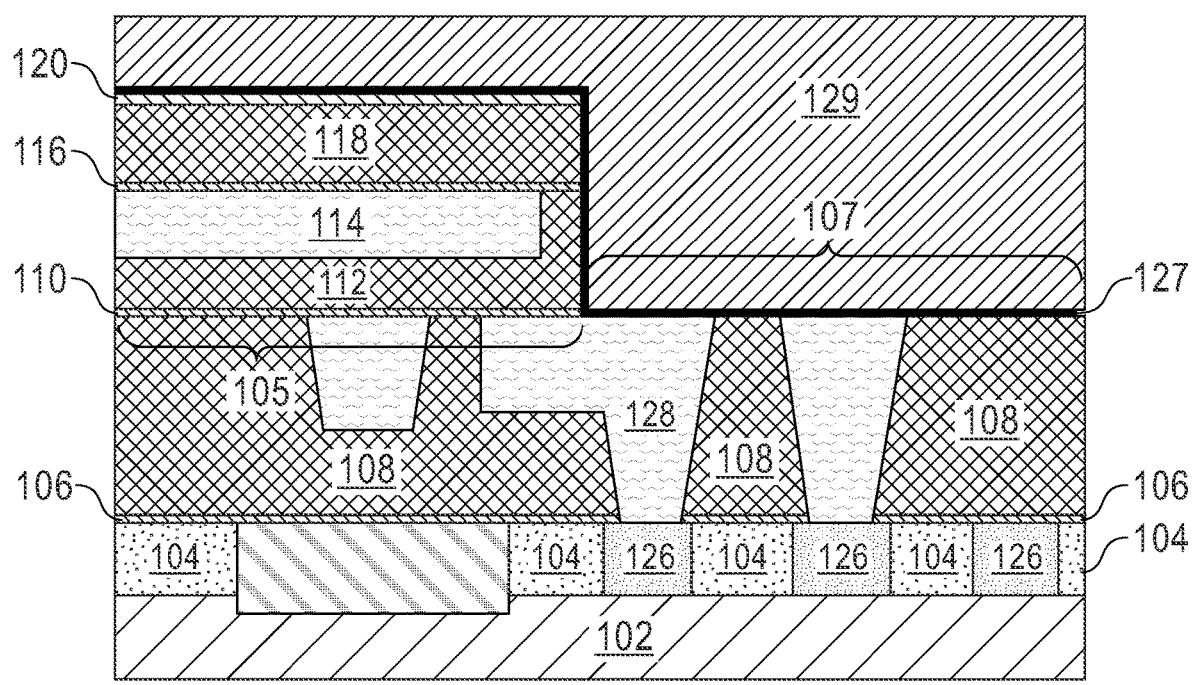
FIG. 4 depicts a side cross-sectional view of a structure with a back-end-of-line interconnect structure, of an embodiment of the disclosure.

Next in the method 1000, a first conductive material layer 129 is formed, in S1004, on the M3 ILD layer 118 and a second portion 107 of the M1 ILD layer 108. The formed, first conductive material layer 129 is shown in FIG. 4. The first conductive material layer 129 can be deposited in any suitable way and/or grown, such as epitaxially grown. The first conductive material layer 129 can comprise any suitable material in accordance with the embodiments described herein. Examples of suitable materials that can be used to form the conductive material include, but are not limited to, Cu, Ru, Co, etc., and combinations thereof.

Optionally, after S1002 and prior to S1004, a capping layer 127 can be deposited on the M3 ILD layer 118 and the second portion 107 of the M1 ILD layer 108.

Figure 5:
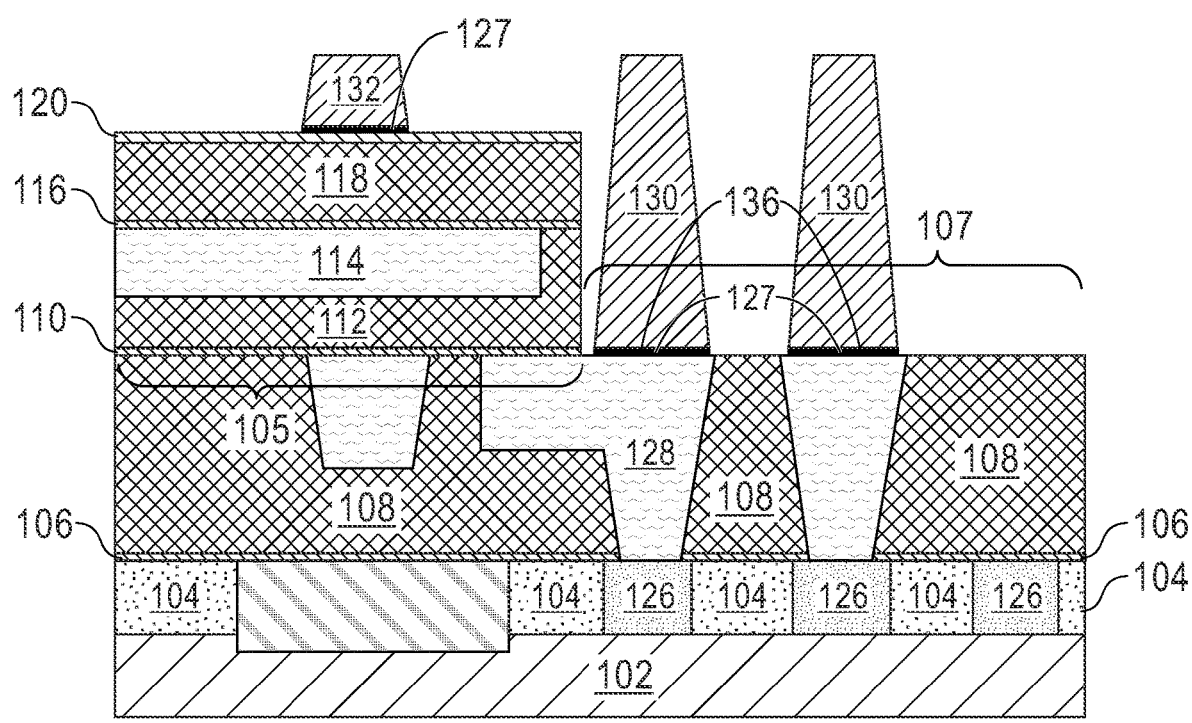
FIG. 5 depicts a side cross-sectional view of a structure with a back-end-of-line interconnect structure, of an embodiment of the disclosure.
Figure 6:
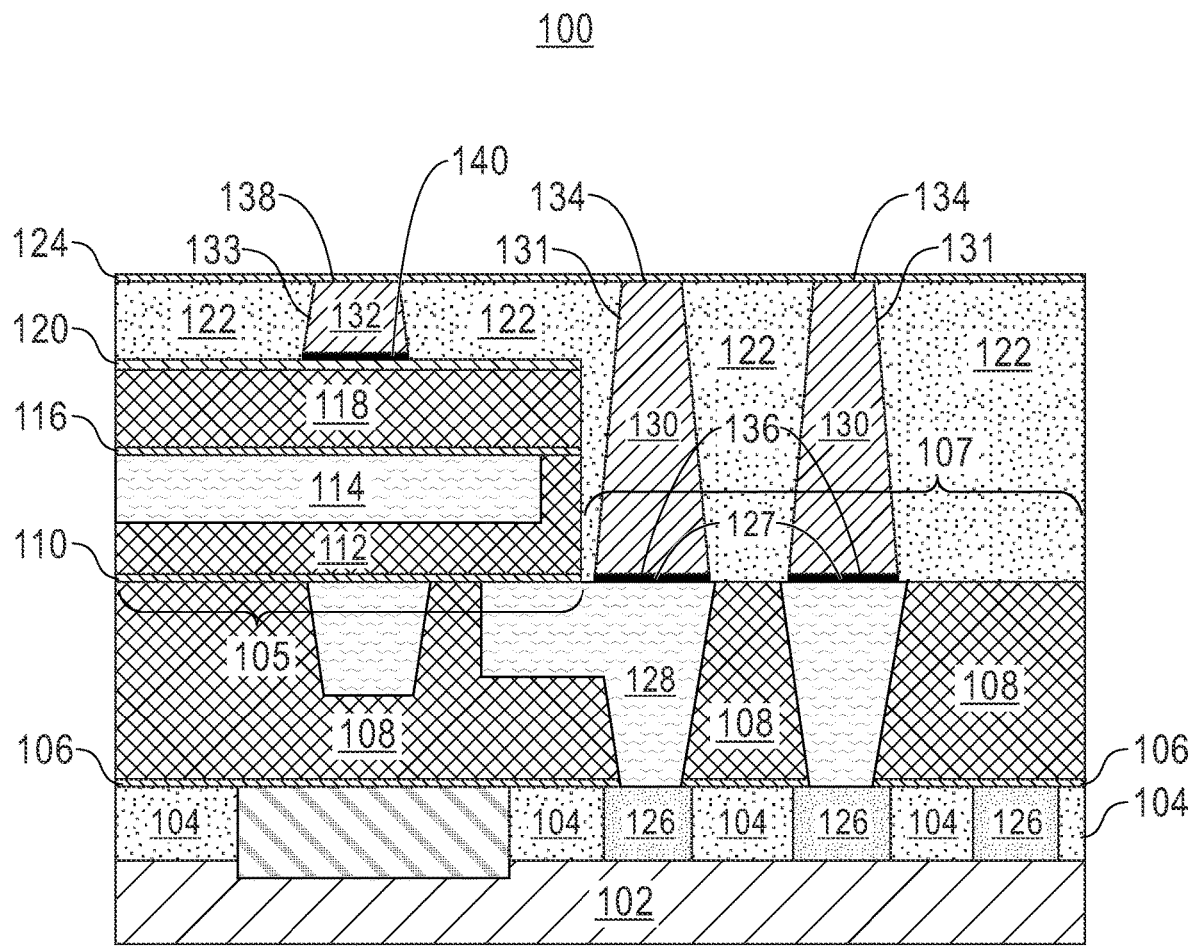
FIG. 6 depicts a side cross-sectional view of a structure with a back-end-of-line interconnect structure, of an embodiment of the disclosure.

Next in the method 1000, the first conductive material layer 129 is subtractively etched, in S1006, to form a super via 130 ($SV_1$) on the second portion 107 of the M1 ILD layer 108. If capping layer 127 had been deposited, this S1006 will also subtractively etch portions of the capping layer 127 that are not between the first conductive material layer 129 remaining after S1006 and the M1 ILD layer 108 or M3 ILD layer 118. This super via 130 is shown in FIG. 5. As seen in FIG. 6, a first end 136 of the super via 130 is connected to the BEOL interconnect structure 128, and a second end 134 of the super via 130 is distance (in direction Y-Y') from the M1 ILD layer 108 that is larger than a height distance (in direction Y-Y') of the M2 ILD layer 112. Although in this embodiment the super via 130 connects the M1 ILD layer 108 to a capping layer 124, thus skipping the M2 ILD layer 112 and the M3 ILD layer 118, in other embodiments the super via 130 can connect an M1 ILD layer to an M3 ILD layer, thus skipping the M2 ILD layer, or, the super via 130 can connect an M1 ILD layer to a vertically (in direction Y-Y") higher layer beyond an M3 ILD layer.

Also formed in S1006 is a conductive line 132 on the M3 ILD layer 118. The conductive line 132 includes a line first end 140 and a line second end 138, wherein the line first end 140 is nearer the M3 ILD layer 118 than the line second end 138. In contrast to the BEOL interconnect structure, which has a geometry, as seen in FIGS. 1-6, resulting from a damascene trench formation process, the super via 130 and the conductive line 132 have a geometry, as seen in FIGS. 5 and 6, resulting from a subtractive etch process.

As the conductive line 132 and the super via 130 are formed by a subtractive etch process, a sidewall 131 of the super via 130 and a sidewall 133 of the conductive line 132 have substantially the same slope.

Optionally, according to the etching step of S1006, the second end 134 of the super via 130 and the line second end 138 of the conductive line 132 can be substantially coplanar. In other embodiments, the second end 134 of the super via 130 and the line second end 138 of the conductive line 132 can be at different heights (in direction Y-Y').

Upon formation of the super via 130 and the conductive line, an additional optional step of the method 1000 can occur, which is forming an ILD via layer 122 in S1008. The ILD via layer 122 can be of the same material as one or more of the first ILD layer 104, the M1 ILD layer 108, the M2 ILD layer 112 and the M3 ILD layer 118. The ILD via layer 122 can be formed through any suitable deposition and/or growth method.

The ILD via layer 122 can thereafter have a cap layer 124 formed on it. The cap layer 124 can be of the same material as one or more of the caping layer 106, the capping layer 110, the capping layer 116 and the capping layer 120. This cap layer 124 can be a protective layer that covers the ILD via layer 122, and each of the line second end 138 of the conductive line 132 and the second end 134 of the super via 130.

Figure 7:
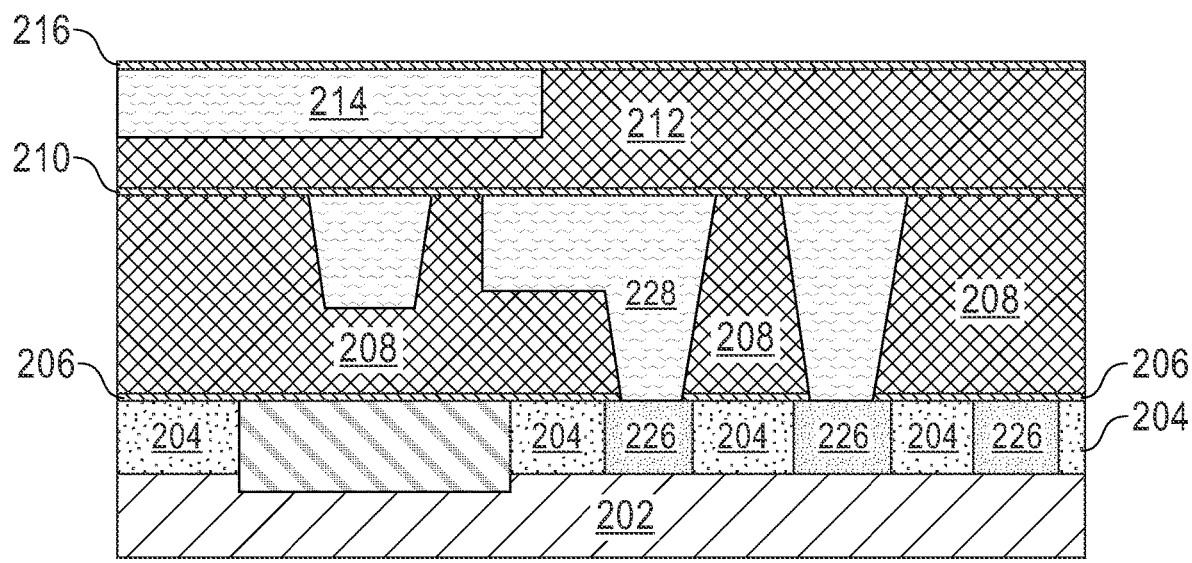
FIG. 7 depicts a side cross-sectional view of a structure with a back-end-of-line interconnect structure, of an embodiment of the disclosure.

Another embodiment of a semiconductor device 200 is shown in FIG. 7. Elements shown in FIG. 7 are comparable to those of FIG. 1, with the first digit in this embodiment being 2 rather than 1 in the semiconductor device 100 embodiment. For example, the substrate 102 of the semiconductor device 100 is comparable, in formation and composition, to the substrate 202 of the semiconductor device 200 embodiment. Thus, all reference numbers with the last two numbers being the same between semiconductor device 200 and the semiconductor device 100 are comparable, or the same, in formation and composition.

Figure 8A:
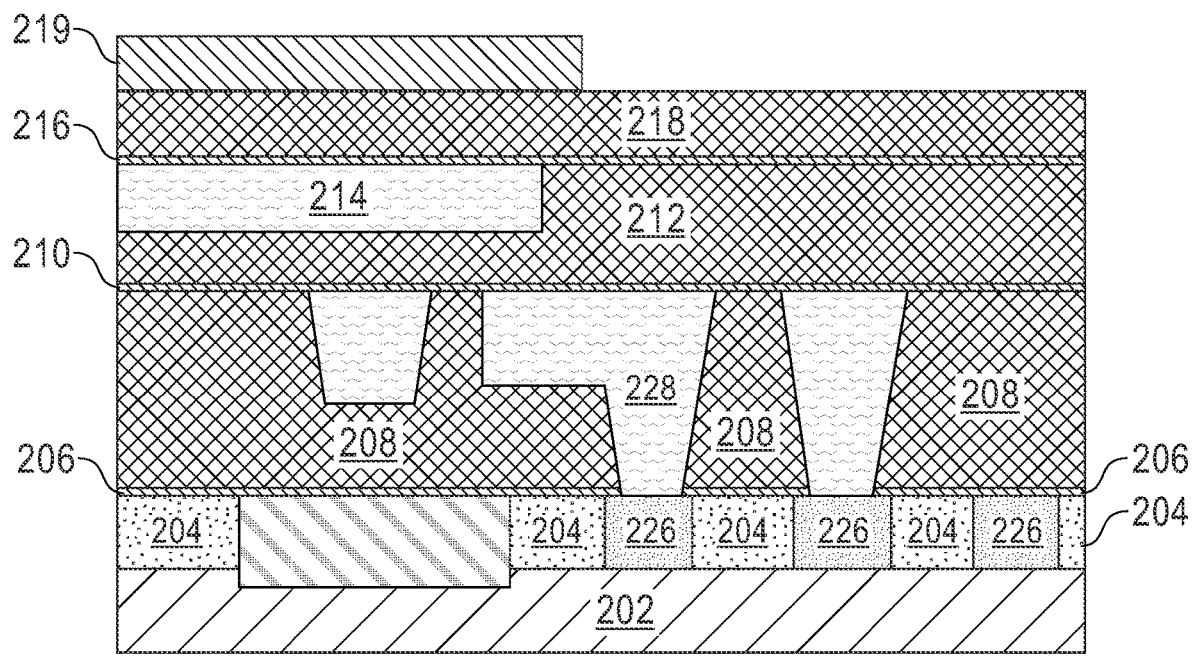
FIG. 8A depicts a side cross-sectional view of a structure with a back-end-of-line interconnect structure, of an embodiment of the disclosure.
Figure 8B:
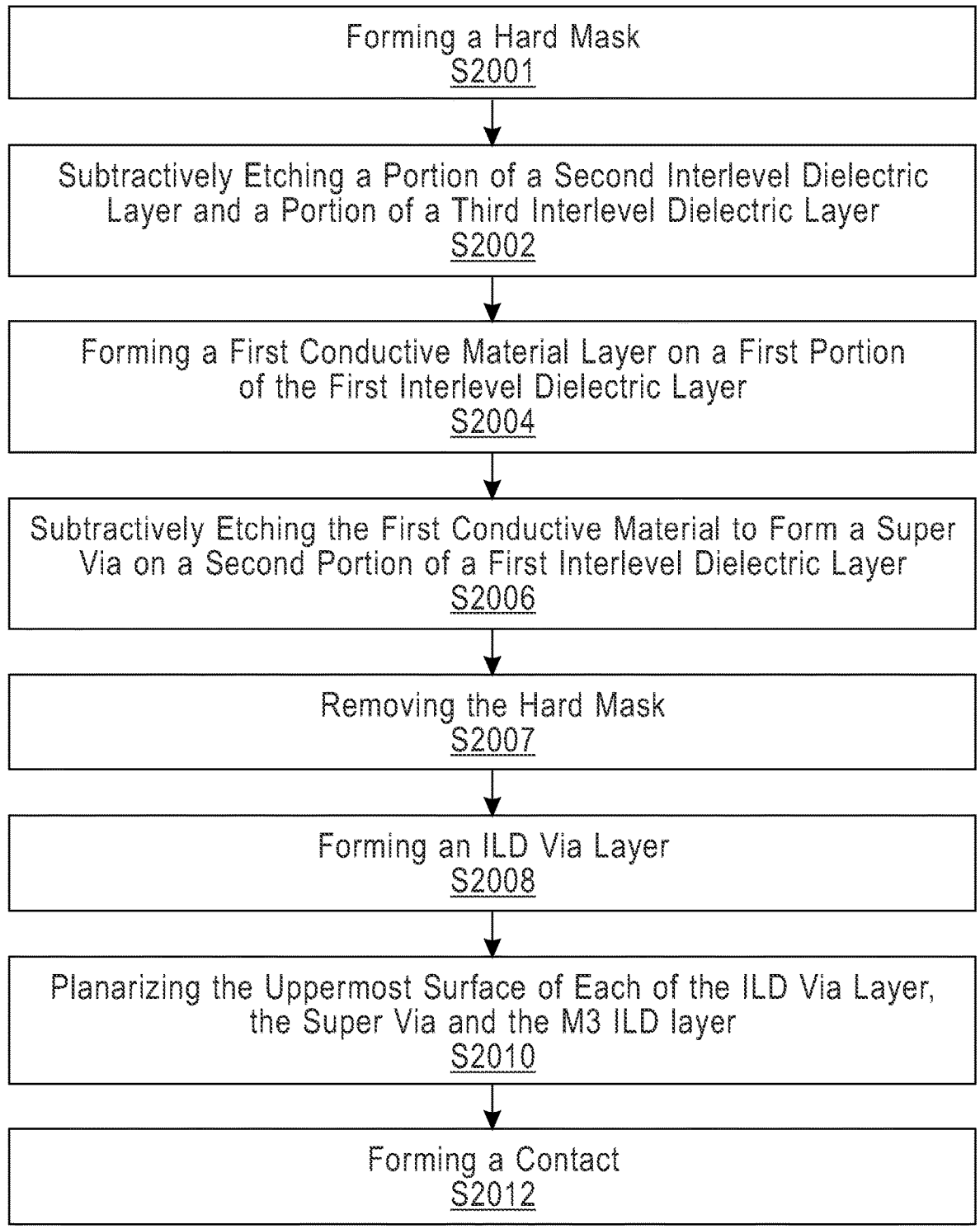
FIG. 8B depicts a process flow for a structure of an embodiment of the disclosure.
Figure 9:
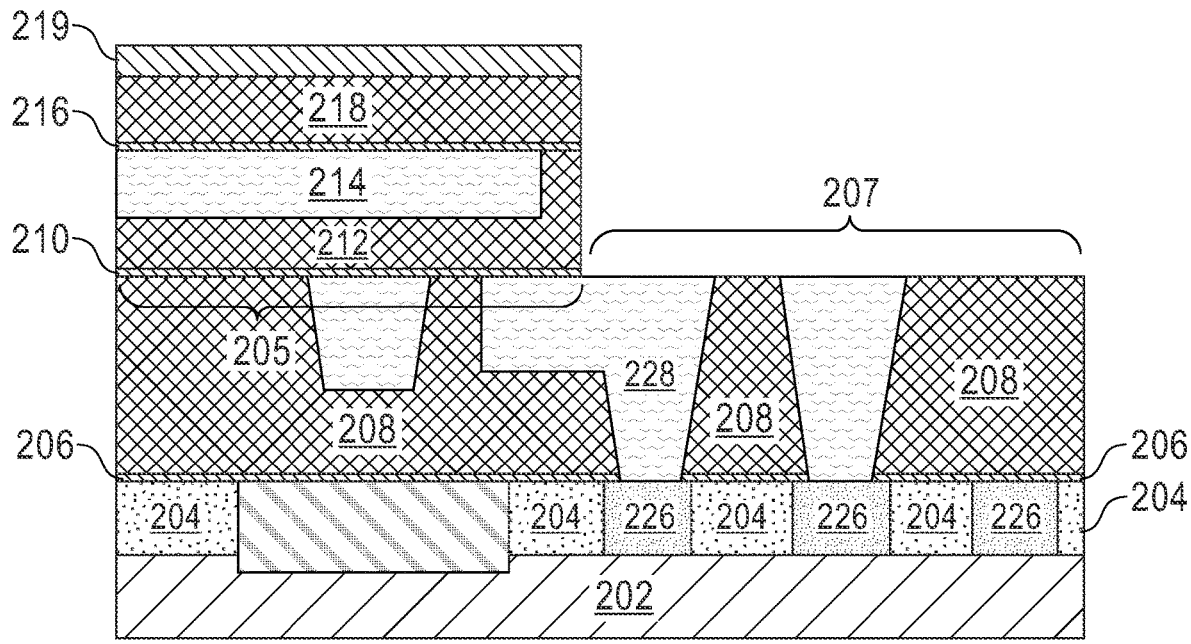
FIG. 9 depicts a side cross-sectional view of a structure with a back-end-of-line interconnect structure, of an embodiment of the disclosure.

For semiconductor device 200, FIGS. 1 and 7 are formationally and compositionally equivalent. In FIG. 8, the semiconductor device 200 includes an M3 ILD layer 218, with a hard mask 219 formed, in S2001 of method 2000 of FIG. 8B, on a portion of that M3 ILD layer 218. The hard mask 219 may be formed of titanium nitride (TiN), silicon nitride (SiN), tantalum nitride (TaN) or another suitable material using any suitable deposition process (e.g., chemical vapor deposition (CVD), physical vapor deposition (PVD), atomic layer deposition (ALD), etc.). The hard mask may have a height or vertical thickness (in direction Y-Y') in the range of several hundred nanometers.

After S2001, in S2002 a portion of the M2 ILD layer 212 and a portion of the M3 ILD layer 218 are subtractively etched, using any suitable etching procedure (e.g. reactive-ion-etching (RIE)), without substantial etching occurring to the hard mask 219. This subtractive etching occurs in S2002 of method 2000 of FIG. 8B. The M2 ILD layer 212 is disposed on a first portion 205 of the M1 ILD layer 208, with the M3 ILD layer 218 remaining after S2002 disposed on the portion of the M2 ILD layer 212 remaining after S2002.

Figure 10:
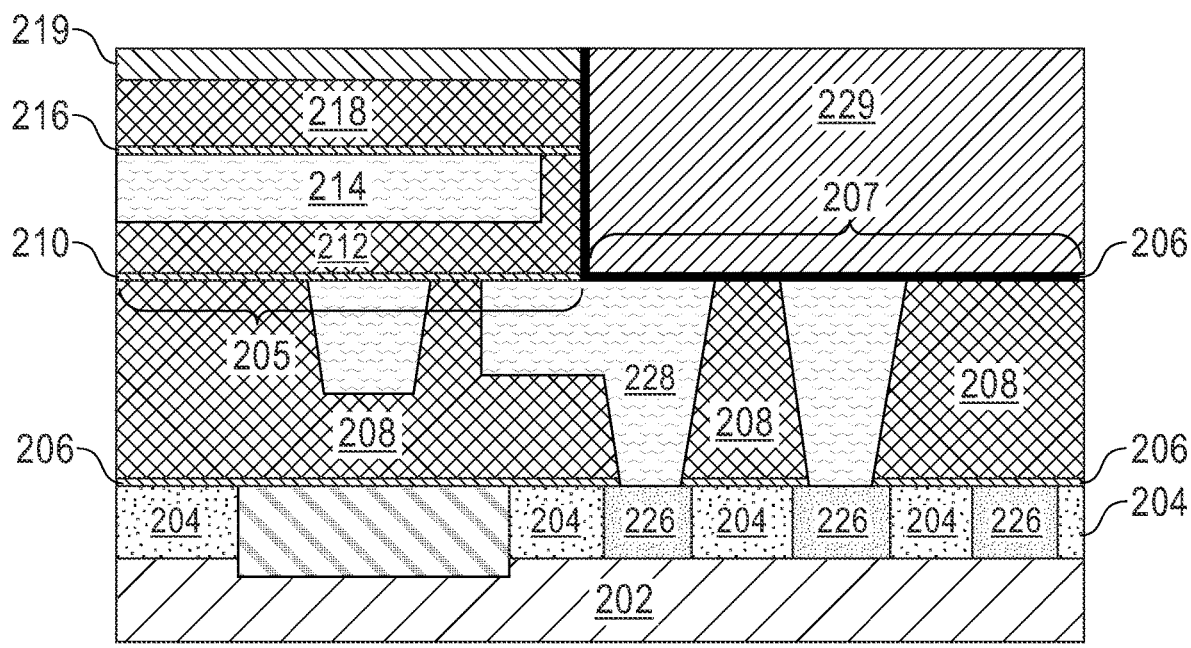
FIG. 10 depicts a side cross-sectional view of a structure with a back-end-of-line interconnect structure, of an embodiment of the disclosure.

Next in the method 2000, a first conductive material layer 229 is formed, in S2004, on a second portion 207 of the M1 ILD layer 208. The formed, first conductive material layer 229 is shown in FIG. 10.

Optionally, after S2002 and prior to S2004, a capping layer 227 can be deposited on the second portion 207 of the M1 ILD layer 208.

Figure 11:
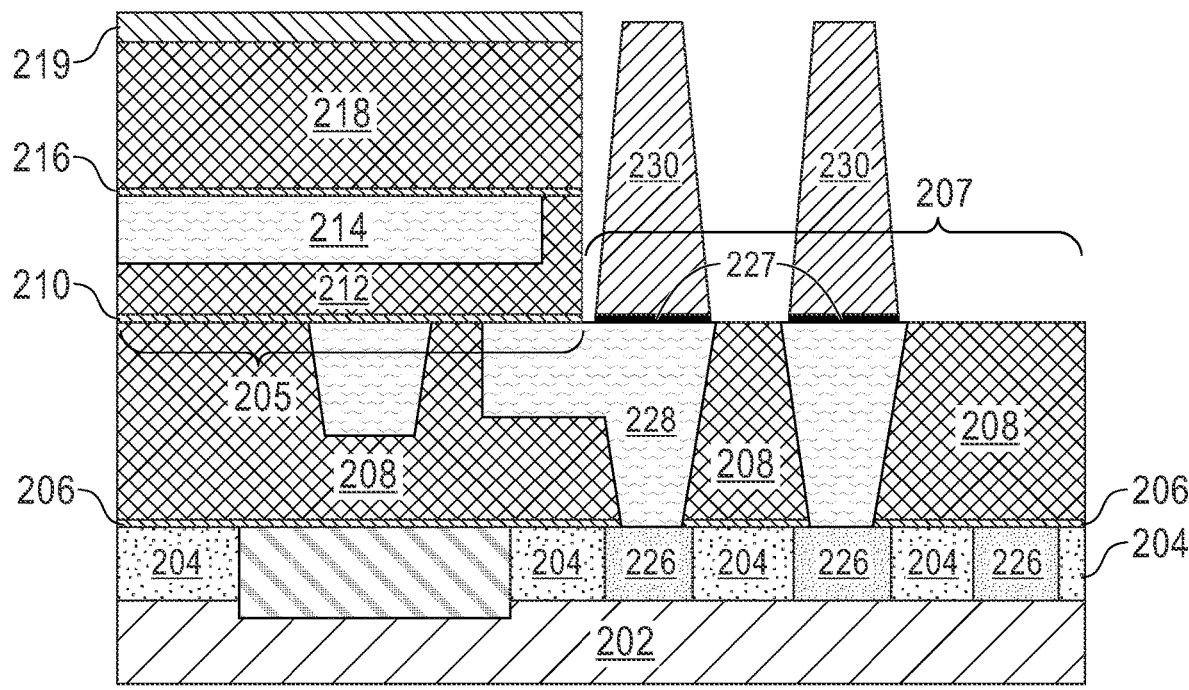
FIG. 11 depicts a side cross-sectional view of a structure with a back-end-of-line interconnect structure, of an embodiment of the disclosure.

Next in the method 2000, the first conductive material layer 229 is subtractively etched, in S2006, to form a super via 230 ($SV_1$) on the second portion 207 of the M1 ILD layer 208, while the hard mask 219 remains substantially not etched. If capping layer 227 had been deposited, this S2006 will also subtractively etch portions of the capping layer 227 that are not between the first conductive material layer 229 remaining after S2006 and the M1 ILD layer 208. This super via 230 is shown in FIG. 11.

Figure 12:
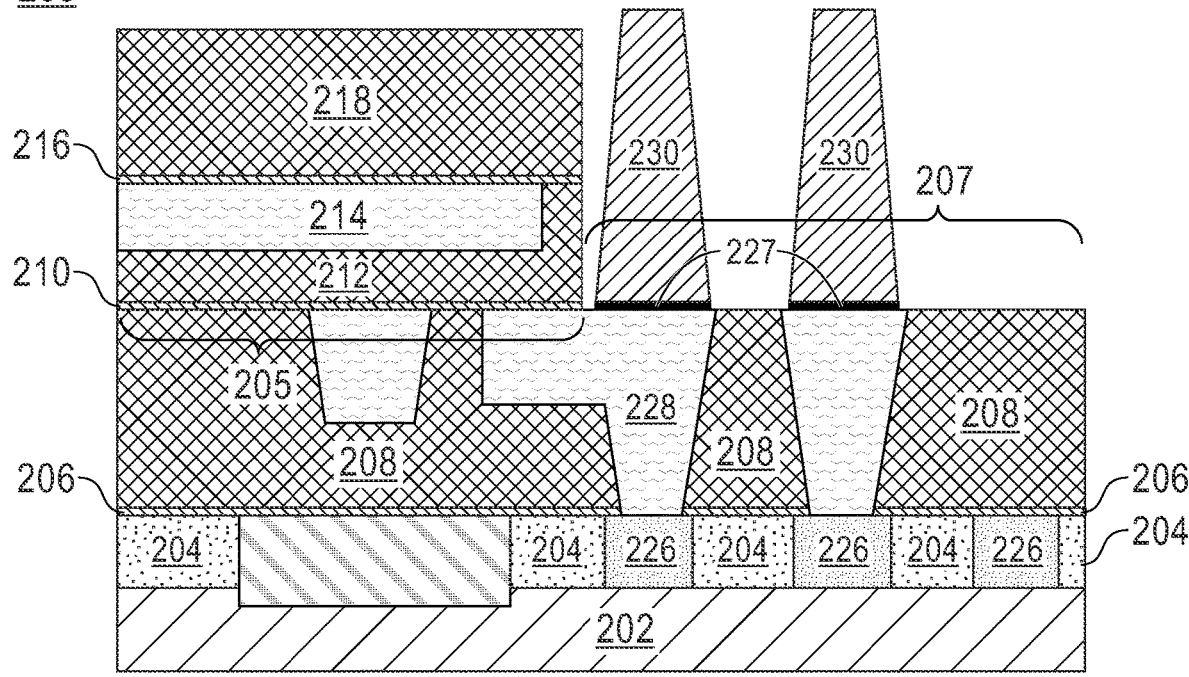
FIG. 12 depicts a side cross-sectional view of a structure with a back-end-of-line interconnect structure, of an embodiment of the disclosure.

After S2006, the hard mask is removed in S2007 using any suitable wet and/or dry technique. After S2007 the device 200 is as shown in FIG. 12.

Figure 13:
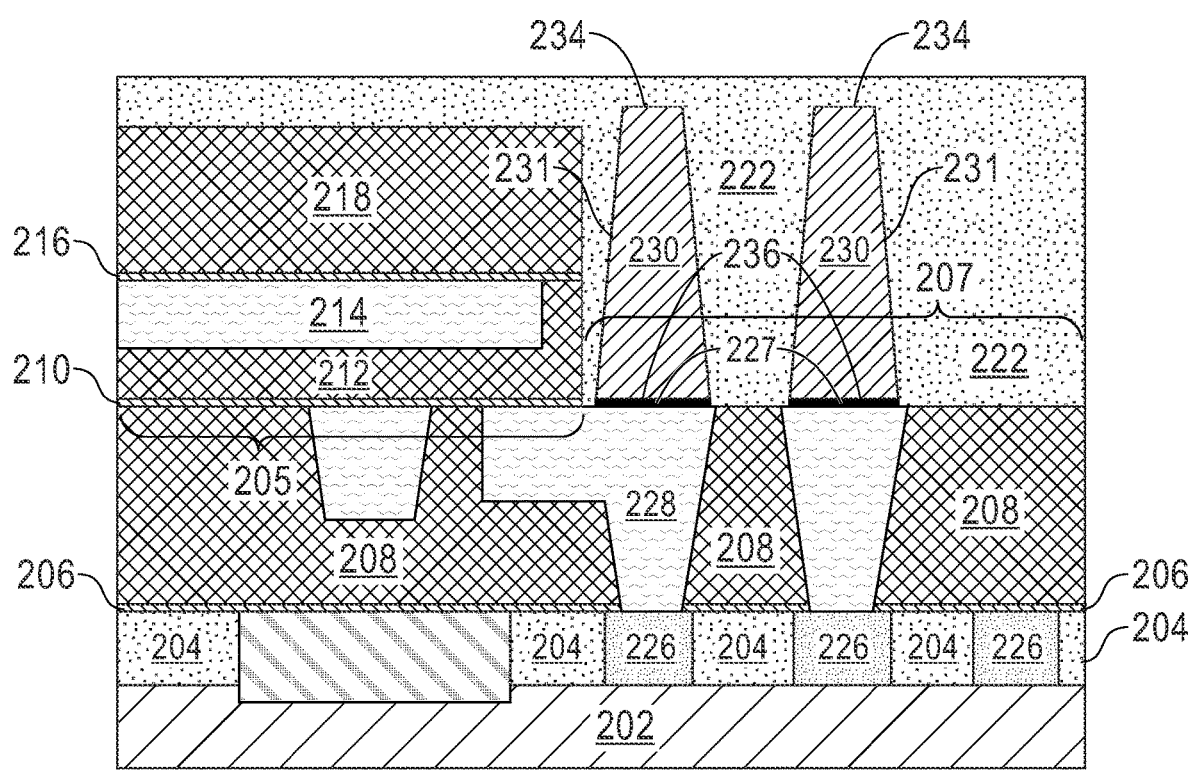
FIG. 13 depicts a side cross-sectional view of a structure with a back-end-of-line interconnect structure, of an embodiment of the disclosure.

Upon formation of the super via 230, an additional optional step of the method 2000 can occur, which is forming an ILD via layer 222 in S2008, as illustrated in FIG. 13. The ILD via layer 222 can be of the same material as one or more of the first ILD layer 204, the M1 ILD layer 208, the M2 ILD layer 212 and the M3 ILD layer 218.

As can be seen in FIG. 13, in this embodiment, the uppermost surface of the ILD via layer 222 is higher (in direction Y-Y') as compared to an upper surface (in direction Y-Y') of the M3 ILD layer 218 and the upper surface (in direction Y-Y') of the super via 230. However, in other embodiments, upon forming the ILD via layer 222, the uppermost surface (in direction Y-Y') of each of the ILD via layer 222, the super via 230 and the M3 ILD layer can be substantially coplanar.

Figure 14:
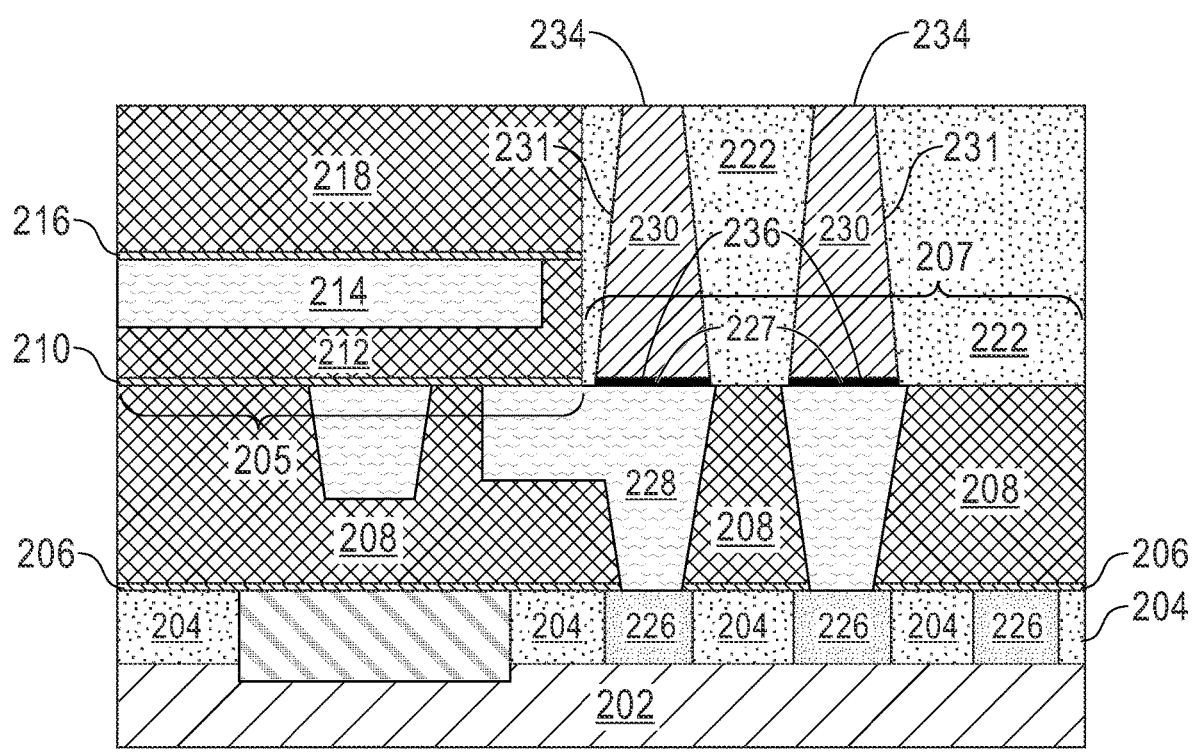
FIG. 14 depicts a side cross-sectional view of a structure with a back-end-of-line interconnect structure, of an embodiment of the disclosure.

In the embodiment of FIG. 13, a further, optional, planarization step, S2012 can be performed, so that the uppermost surface (in direction Y-Y') of each of the ILD via layer 222, the super via 230 and the M3 ILD layer are substantially coplanar. Step S2012 is shown in FIG. 8B. The device 200, as a result of the planarization, is shown in FIG. 14.

Figure 15:
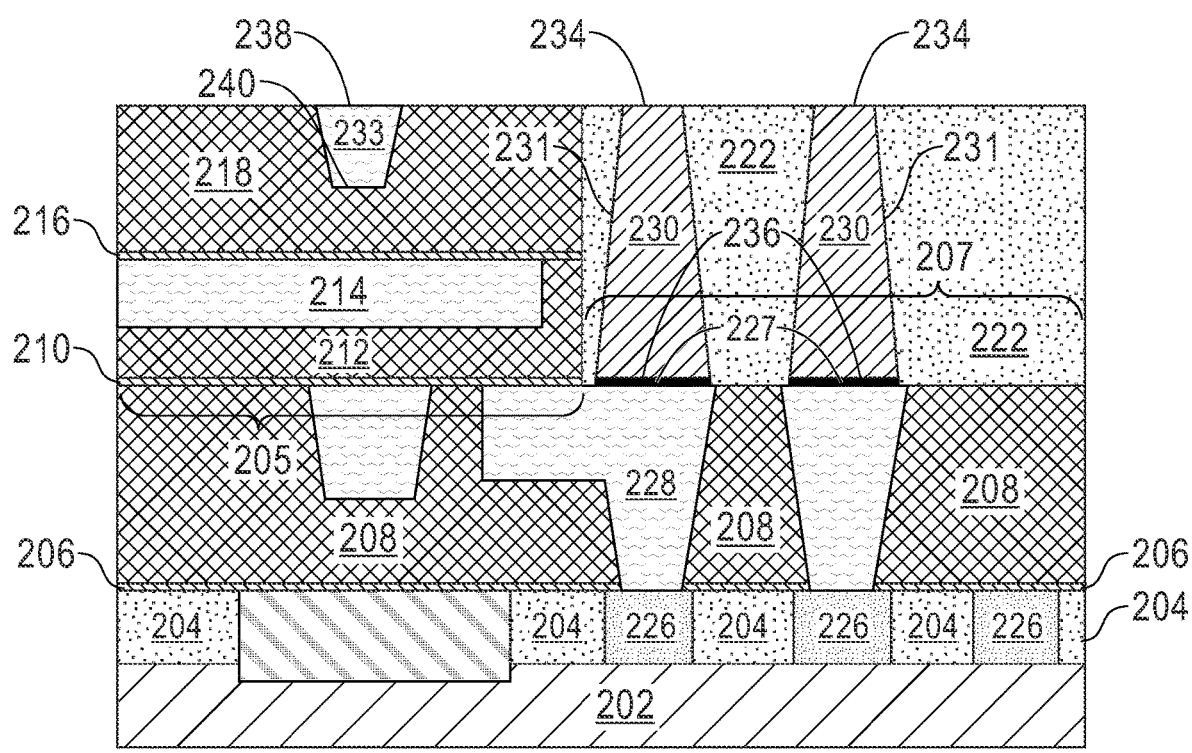
FIG. 15 depicts a side cross-sectional view of a structure with a back-end-of-line interconnect structure, of an embodiment of the disclosure.

After the uppermost surface (in direction Y-Y') of each of the ILD via layer 222, the super via 230 and the M3 ILD layer are substantially coplanar, a further optional step of forming a contact 233, step S2012, is performed, as shown in FIG. 15. The contact 233 can be formed by any suitable damascene scheme (e.g., filling a trench with conductive material). The composition of contact 233 can be the same, or different, composition as interconnect structure 128 may be formed of Cu, or another suitable material.

As can be seen in FIG. 15 a second surface 238 of the contact 233, the second surface 238 of the contact 233 being opposite the first surface 240 of the contact 233, is substantially coplanar with a second end 234 of the super via 230, the second end 234 of the super via 230 opposite the first end 236 of the super via 230.

Figure 16:
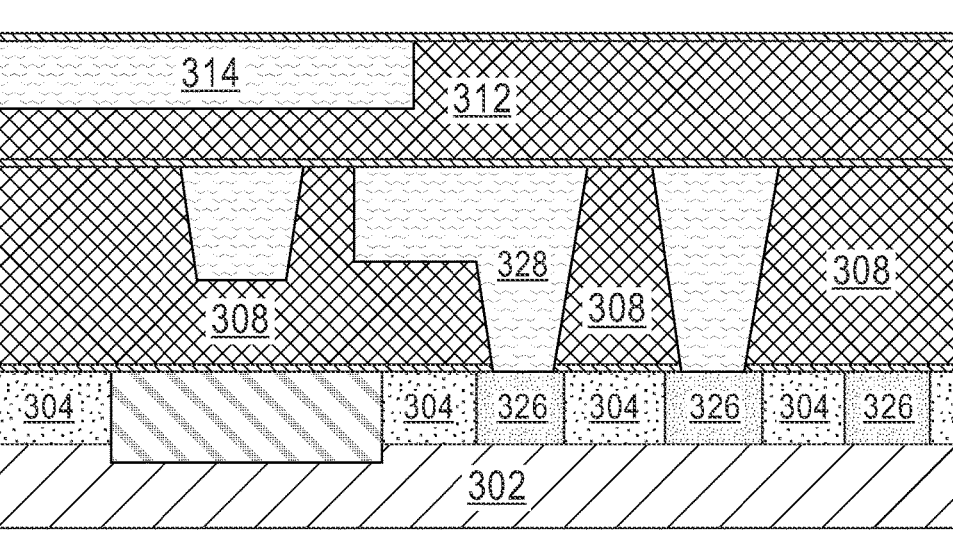
FIG. 16 depicts a side cross-sectional view of a structure with a back-end-of-line interconnect structure, of an embodiment of the disclosure.

Another embodiment of a semiconductor device 300 is shown in FIG. 16. Elements shown in FIG. 16 are comparable to those of FIGS. 1 and 7, with the first digit in this embodiment being 3 rather than 1 or 2 in the semiconductor device 100 embodiment or the semiconductor device 200 embodiment, respectively. For example, the substrate 102 of the semiconductor device 100 is comparable, in formation and composition, to the substrate 302 of the semiconductor device 300 embodiment. Thus, all reference numbers with the last two numbers being the same between semiconductor device 300, the semiconductor device 200, and the semiconductor device 100 are comparable, or the same, in formation and composition.

For semiconductor device 300, FIGS. 1, 7, and 16 are formationally and compositionally equivalent. In FIG. 16, the semiconductor device 300 includes an M3 ILD layer 318, with a hard mask 319 formed, in S3001 of method 3000 of FIG. 17B, on all or substantially all of an upper surface of that M3 ILD layer 318. The hard mask 319 may be formed of titanium nitride (TiN), silicon nitride (SiN), tantalum nitride (TaN) or another suitable material using any suitable deposition process (e.g., chemical vapor deposition (CVD), physical vapor deposition (PVD), atomic layer deposition (ALD), etc.). The hard mask may have a height or vertical thickness (in direction Y-Y') in the range of several hundred nanometers.

After S3001, a portion of the hard mask 319 vertically above (in the direction of Y-Y') a second portion 307 of the M1 ILD layer 308, is removed in S3002. The portion of the hard mask 319 removed in S3002 can be removed using any suitable wet and/or dry technique.

After S3002, in S3003 a portion of the M2 ILD layer 312 and a portion of the M3 ILD layer 318 are subtractively etched, using any suitable etching procedure (e.g. reactive-ion-etching (RIE)), without substantial etching occurring to the remaining portion of the hard mask 319. This subtractive etching occurs in S3003 of method 3000 of FIG. 17B. The M2 ILD layer 312 is disposed on a first portion 305 of the M1 ILD layer 308, with the portion of the M3 ILD layer 318 remaining after S3003 disposed on the portion of the M2 ILD layer 312 remaining after S3003.

Figure 19:
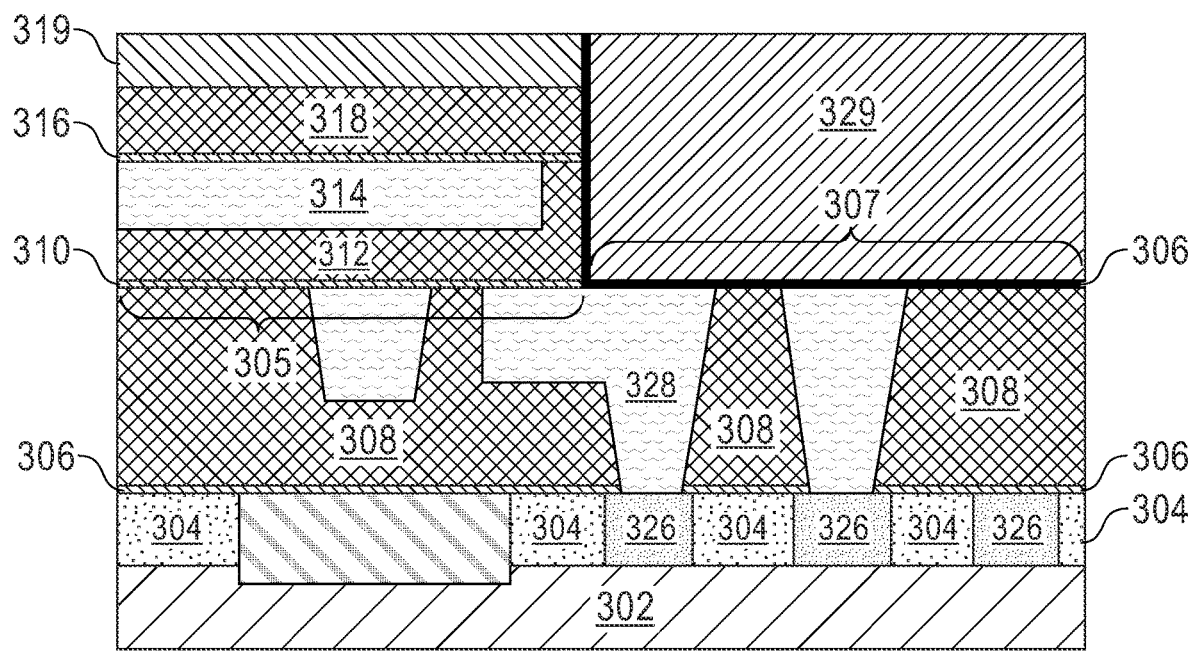
FIG. 19 depicts a side cross-sectional view of a structure with a back-end-of-line interconnect structure, of an embodiment of the disclosure.

Next in the method 3000, a first conductive material layer 329 is formed, in S3004, on a second portion 307 of the M1 ILD layer 308. The formed, first conductive material layer 329 is shown in FIG. 19.

Optionally, after S3003 and prior to S3004, a capping layer 327 can be deposited on the second portion 307 of the M1 ILD layer 308.

Figure 20:
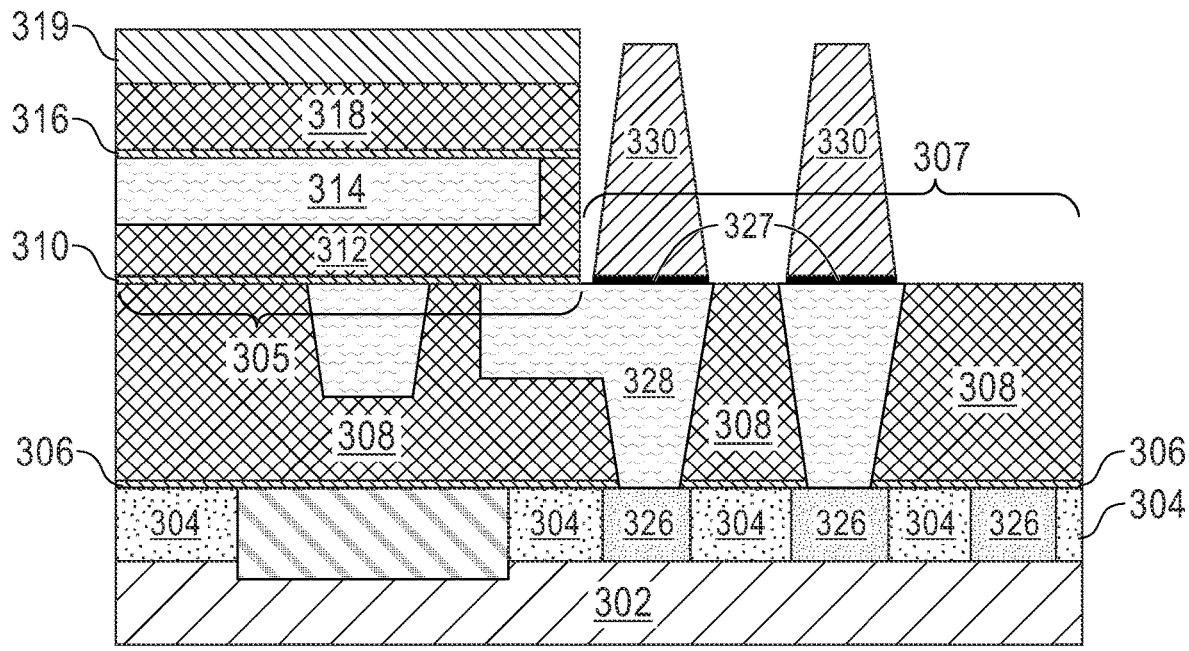
FIG. 20 depicts a side cross-sectional view of a structure with a back-end-of-line interconnect structure, of an embodiment of the disclosure.

Next in the method 3000, the first conductive material layer 329 is subtractively etched, in S3006, to form a super via 330 ($SV_1$) on the second portion 307 of the M1 ILD layer 308, while the hard mask 319 remains substantially not etched. If capping layer 327 had been deposited, this S3006 will also subtractively etch portions of the capping layer 327 that are not between the first conductive material layer 329 remaining after S3006 and the M1 ILD layer 308. This super via 330 is shown in FIG. 20.

Figure 21:
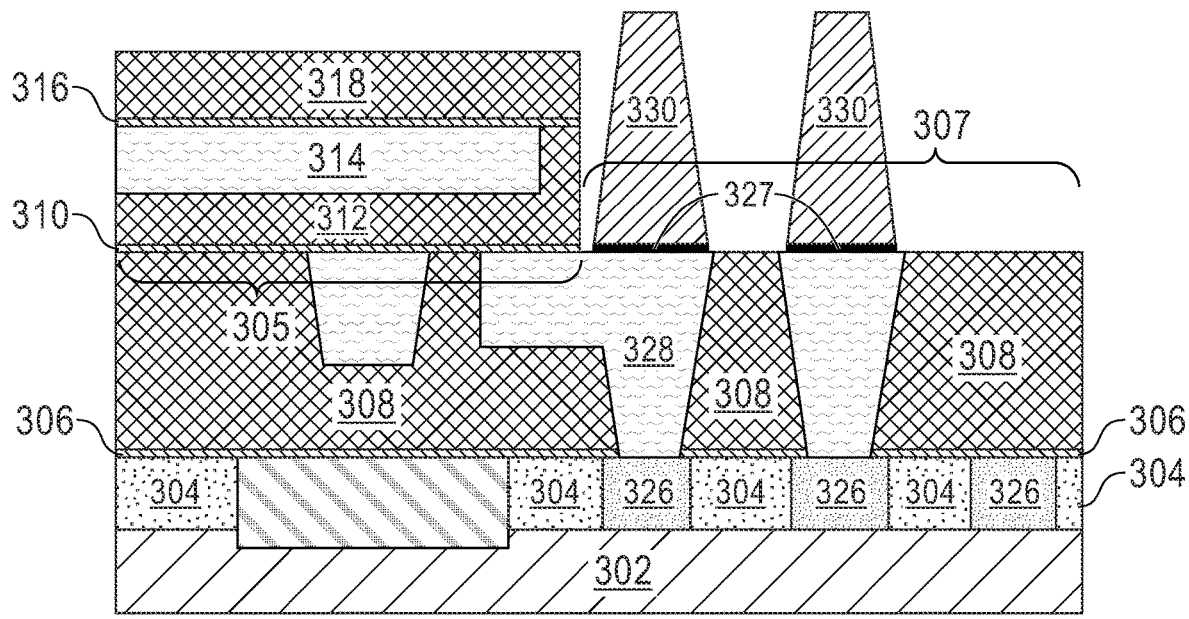
FIG. 21 depicts a side cross-sectional view of a structure with a back-end-of-line interconnect structure, of an embodiment of the disclosure.

After S3006, the hard mask is removed in S3007 using any suitable wet and/or dry technique. After S3007 the device 300 is as shown in FIG. 21.

Figure 17A:
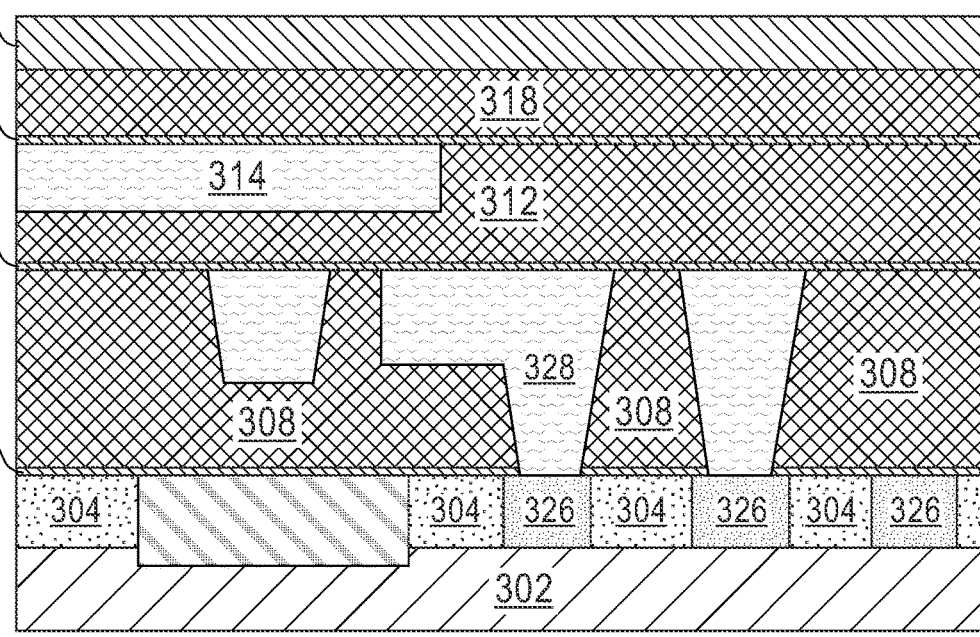
FIG. 17A depicts a side cross-sectional view of a structure with a back-end-of-line interconnect structure, of an embodiment of the disclosure.
Figure 17B:
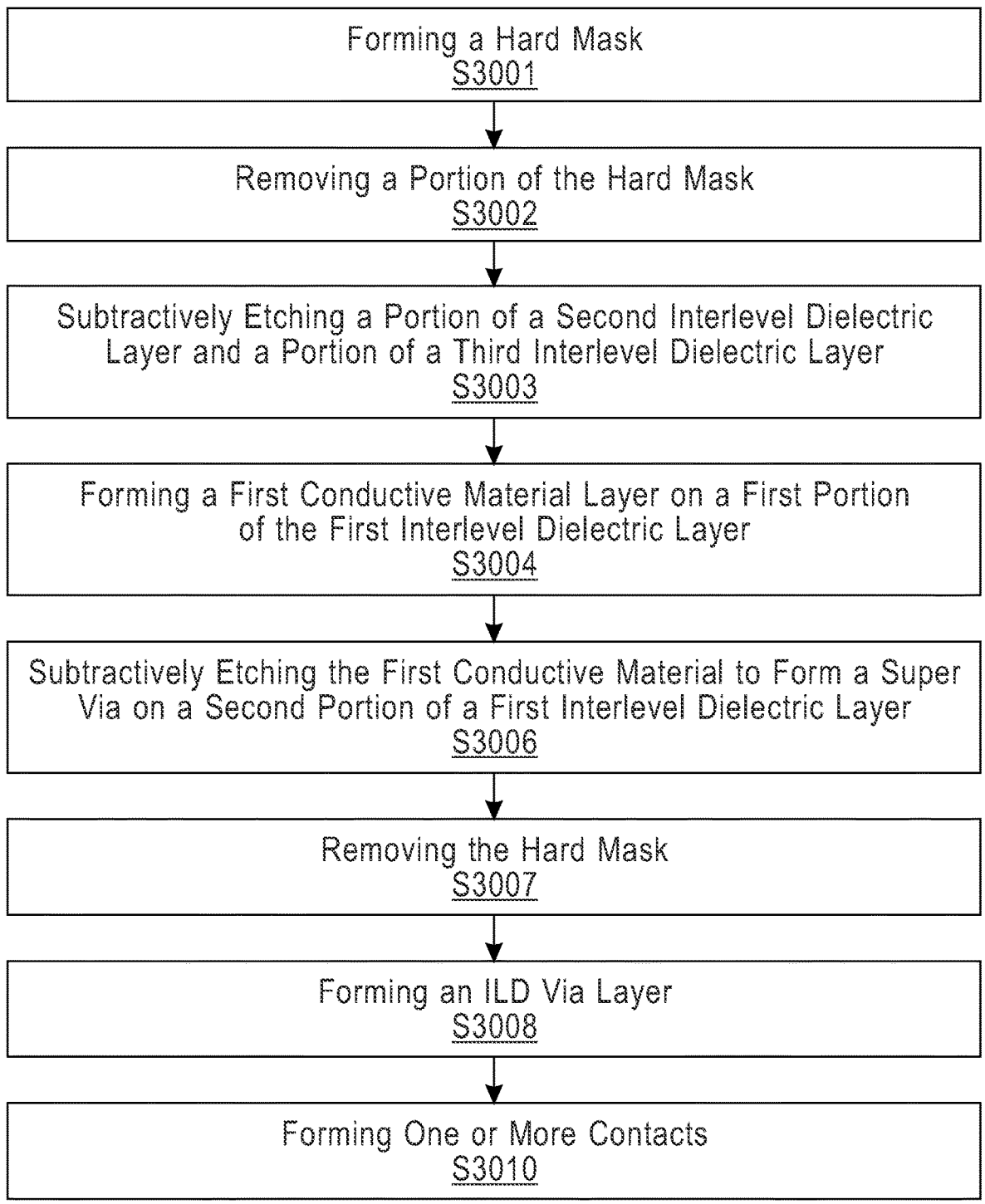
FIG. 17B depicts a process flow for a structure of an embodiment of the disclosure.
Figure 18:
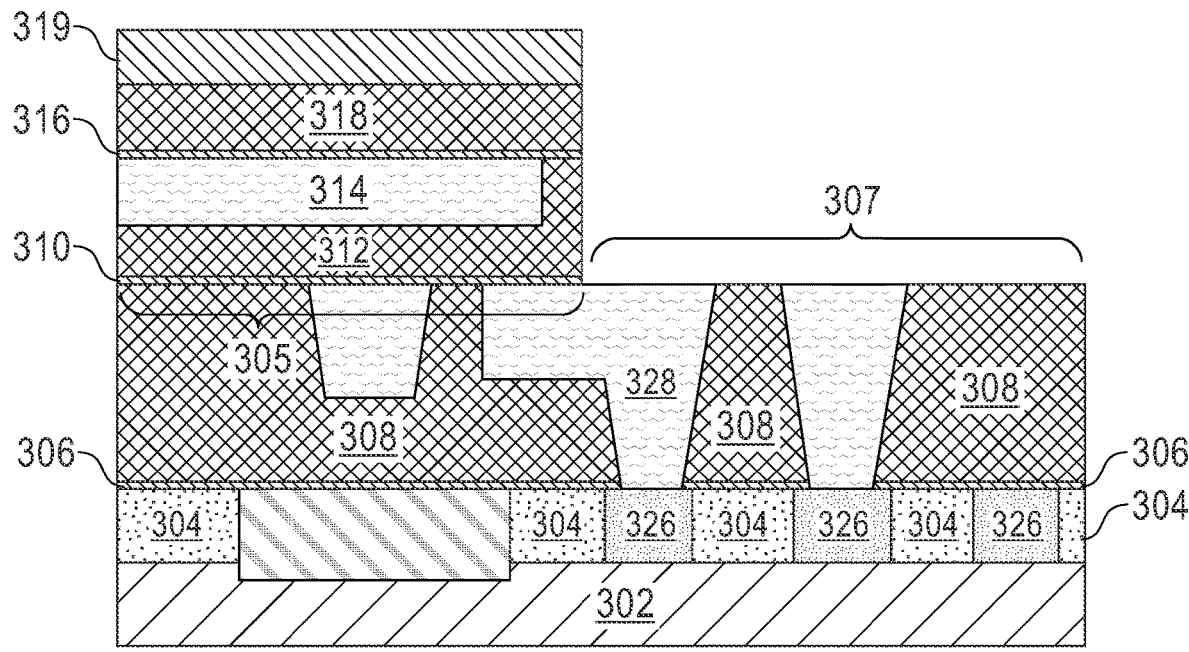
FIG. 18 depicts a side cross-sectional view of a structure with a back-end-of-line interconnect structure, of an embodiment of the disclosure.
Figure 22:
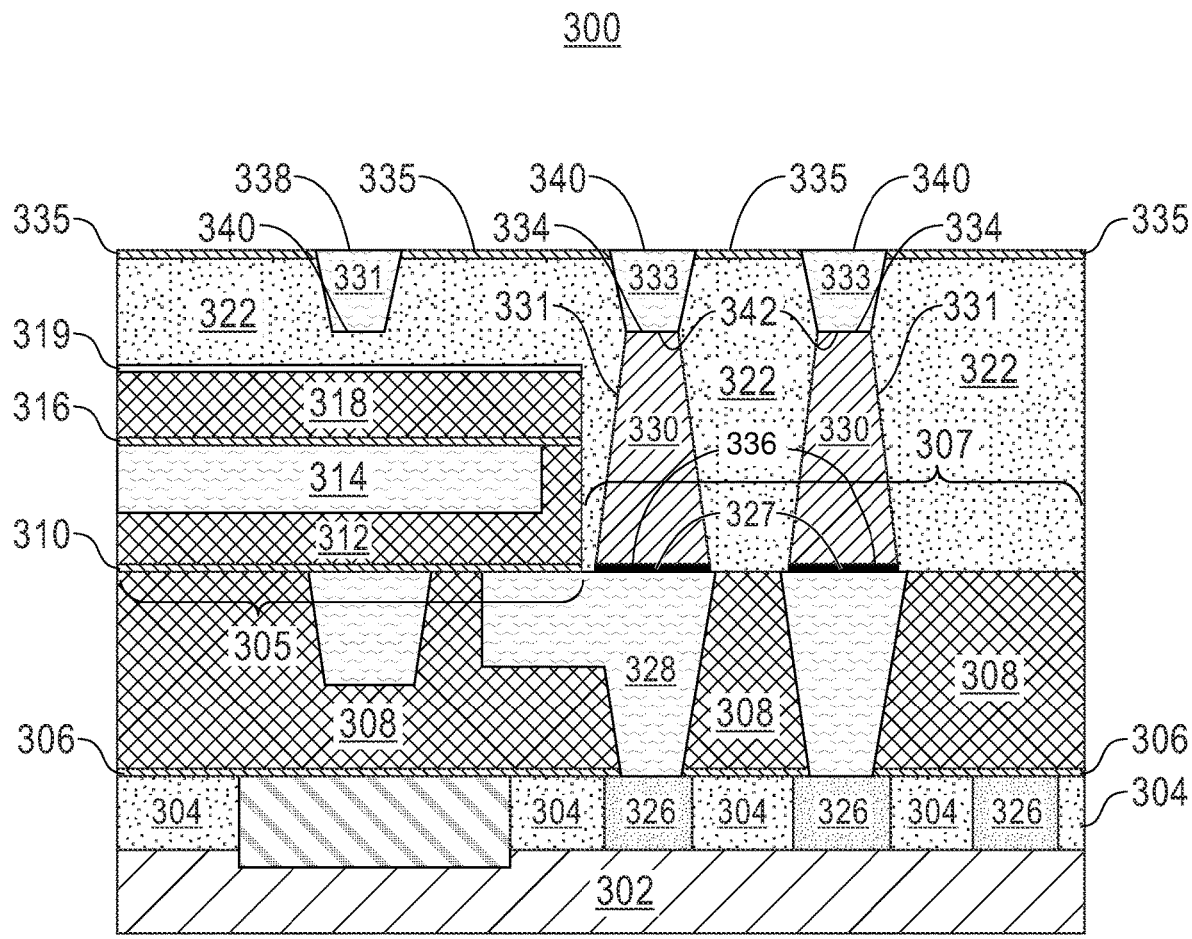
FIG. 22 depicts a side cross-sectional view of a structure with a back-end-of-line interconnect structure, of an embodiment of the disclosure.

Upon formation of the super via 330, an additional optional step of the method 3000 can occur, which is forming an ILD via layer 322 in S3008, as illustrated in FIGS. 17B and in FIG. 22. The ILD via layer 322 can be of the same material as one or more of the first ILD layer 404, the M1 ILD layer 308, the M2 ILD layer 312 and the M3 ILD layer 318.

After S3008, a further, optional, step of the method 3000 can occur, which is forming of one or more of contacts 331 and 333 in S3010, as shown in FIG. 22. Each of contacts 331 and 333 can be formed by any suitable damascene scheme (e.g., filling a trench with conductive material). The composition of each of contacts 231 and 233 can be the same, or different, compositionally as interconnect structure 128, and each may be formed of Cu, or another suitable material.

As can be seen in FIG. 22 a second surface 338 of the contact 331, the second surface 338 of the contact 331 opposite a first surface 340 of the contact 331, and a second surface 340 of the contact 333, the second surface 340 of the contact 333 opposite a first surface 334 of the contact 333, are substantially coplanar.

Also, as can be seen in this embodiment, each of the first surface 340 of the contact 331, the first surface 334 of the contact 333 and a second end 342 of the super via 330, the second end 342 of the super via 330 opposite a first end 336 of the super via 330, are substantially coplanar. In addition, the contact 333 and the super via 330 can contact each other, with the first surface 334 of the contact 333 being substantially the same width as the second end 342 of the super via 330.

Additionally, a cap layer 335 can be formed on the semiconductor device 300.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor device including a super via connection between levels, comprising:
    a first interlevel dielectric layer;
    a back-end-of-line (BEOL) interconnect structure disposed in the first interlevel dielectric layer;
    a second interlevel dielectric layer disposed on a first portion of the first interlevel dielectric layer;
    a third interlevel dielectric layer disposed on the second interlevel dielectric layer; and
    a super via disposed on a second portion of the first interlevel dielectric layer and in an interlayer dielectric via layer, wherein the super via is spaced apart from the second interlevel dielectric layer and the third interlevel dielectric layer and a first end of the super via is connected to the BEOL interconnect structures and wherein a second end of the super via opposite the first end of the super via is a distance from the first interlevel dielectric layer larger than a height distance of the second interlevel dielectric layer, and wherein the interlayer dielectric via layer is present at least along a sidewall of the second interlevel dielectric layer and the third interlevel dielectric layer.

2. The device of claim 1, further comprising a conductive line disposed on the third interlevel dielectric layer, the conductive line comprising a line first end and a line second end the line second end opposite the line first end, wherein the line first end of the conductive line is nearer the third interlevel dielectric layer than the line second end of the line.

3. The device of claim 2, further comprising a protective layer disposed along the second end of the super via and the second end of the conductive line.

4. The device of claim 2, wherein the second end of the super via is coplanar with the second end of the conductive line.

5. The device of claim 1, wherein the super via is pyramidal in shape having a first width at the first end and a second width at the second end, wherein the first width is greater than the second width.

6. The device of claim 1, wherein the interlayer dielectric via layer extends above, and onto, a topmost surface of the third interlevel dielectric layer.

7. The device of claim 1, wherein the interlayer dielectric via layer has a topmost surface that is coplanar with a topmost surface of the third interlevel dielectric layer.

8. The device of claim 1, wherein the interlayer dielectric via layer has a bottommost surface that is in direct physical contact with a topmost surface of the first interlevel dielectric layer.

9. The device of claim 1, wherein the second interlevel dielectric layer and the third interlevel dielectric layer are devoid of the super via passing through the any portion thereof.

10. The device of claim 1, wherein the interlayer dielectric via layer is a single layered dielectric material.

\* \* \* \* \*